US008296940B2

(12) United States Patent
Woychik et al.

(10) Patent No.: US 8,296,940 B2
(45) Date of Patent: Oct. 30, 2012

(54) METHOD OF FORMING A MICRO PIN HYBRID INTERCONNECT ARRAY

(75) Inventors: Charles Gerard Woychik, Niskayuna, NY (US); John Eric Tkaczyk, Delanson, NY (US); Brian David Yanoff, Niskayuna, NY (US); Tan Zhang, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 298 days.

(21) Appl. No.: 12/762,610

(22) Filed: Apr. 19, 2010

(65) Prior Publication Data

US 2011/0253430 A1     Oct. 20, 2011

(51) Int. Cl.
*H05K 3/34* (2006.01)
(52) U.S. Cl. ............... 29/840; 29/832; 29/837; 29/846; 29/850; 29/860
(58) Field of Classification Search ............ 29/832, 29/837, 840, 842, 846, 850, 852, 860; 174/257, 174/262, 263, 267, 361; 257/772, 779; 73/641
See application file for complete search history.

(56) References Cited

U.S. PATENT DOCUMENTS

| 5,786,597 | A | 7/1998 | Lingren et al. |
| 6,207,944 | B1 | 3/2001 | Spartiotis et al. |
| 6,982,380 | B2 * | 1/2006 | Hoffmann et al. ............ 174/520 |
| 7,223,981 | B1 | 5/2007 | Capote et al. |
| 7,388,281 | B2 * | 6/2008 | Krueger et al. ............... 257/678 |
| 7,554,206 | B2 | 6/2009 | Haba et al. |
| 2003/0183407 | A1 * | 10/2003 | Ma et al. ...................... 174/52.4 |
| 2007/0194243 | A1 | 8/2007 | Chen et al. |
| 2009/0096096 | A1 | 4/2009 | Inoue |

FOREIGN PATENT DOCUMENTS

| EP | 1387402 A2 | 2/2004 |
| WO | 02103755 A2 | 12/2002 |
| WO | 2005065333 A2 | 7/2005 |
| WO | 2009061282 A1 | 5/2009 |

OTHER PUBLICATIONS

Search Report and Written Opinion from corresponding EP Application No. 11162153.8-2203 dated Dec. 8, 2011.
Miyamoto et al., "480x2 Hybrid HgCdTe Infrared Focal Plane Arrays", Proceedings of SPIE, vol. 2269, pp. 397-405, 1994.
Liao et al. "Fatigue and Bridging Study of High-Aspect-Ratio Multicopper-Column Flip-Chip Interconnects Through Solder Joint Shape Modeling", IEEE Transactions on Components and Packaging Technologies, vol. 29, No. 3, pp. 560-569, Sep. 2006.

* cited by examiner

*Primary Examiner* — Derris Banks
*Assistant Examiner* — Tai Nguyen
(74) *Attorney, Agent, or Firm* — Marie-Claire B. Maple

(57) ABSTRACT

A micro pin hybrid interconnect array includes a crystal anode array and a ceramic substrate. The array and substrate are joined together using an interconnect geometry having a large aspect ratio of height to width. The joint affixing the interconnect to the crystal anode array is devoid of solder.

11 Claims, 2 Drawing Sheets

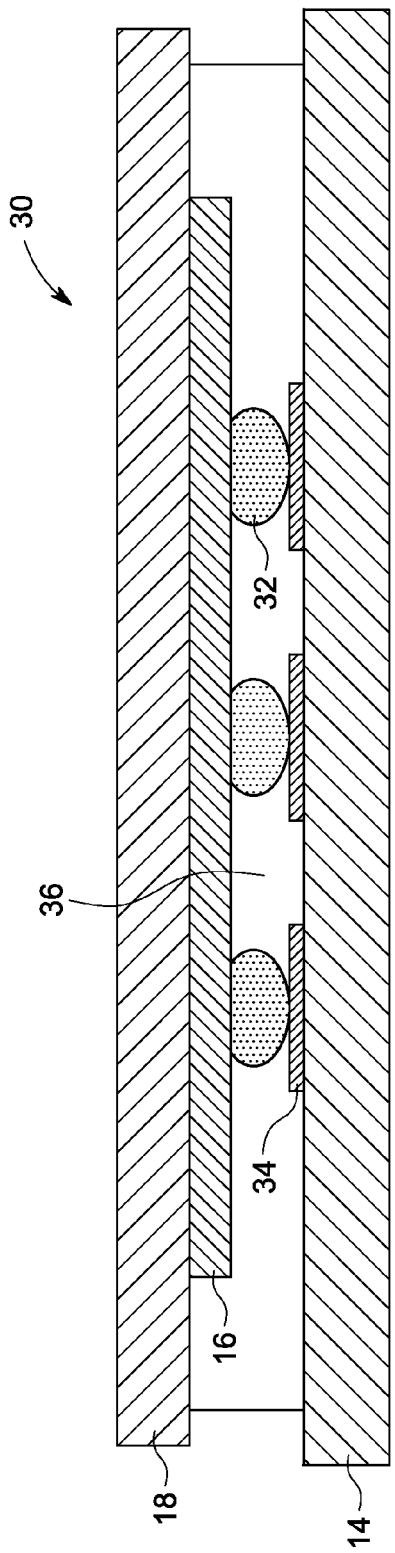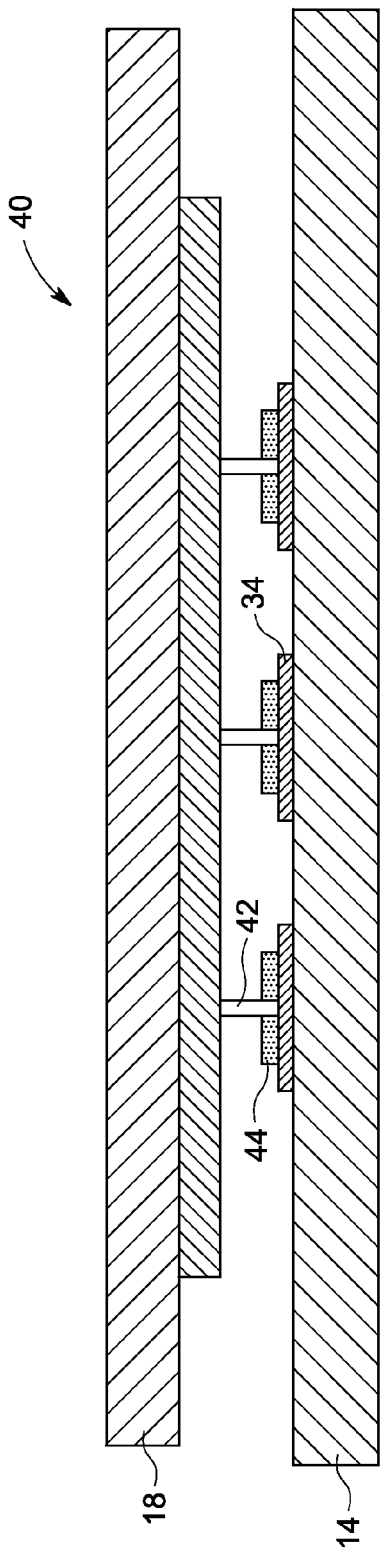

METHOD OF FORMING A MICRO PIN HYBRID INTERCONNECT ARRAY

BACKGROUND

Figure 1:
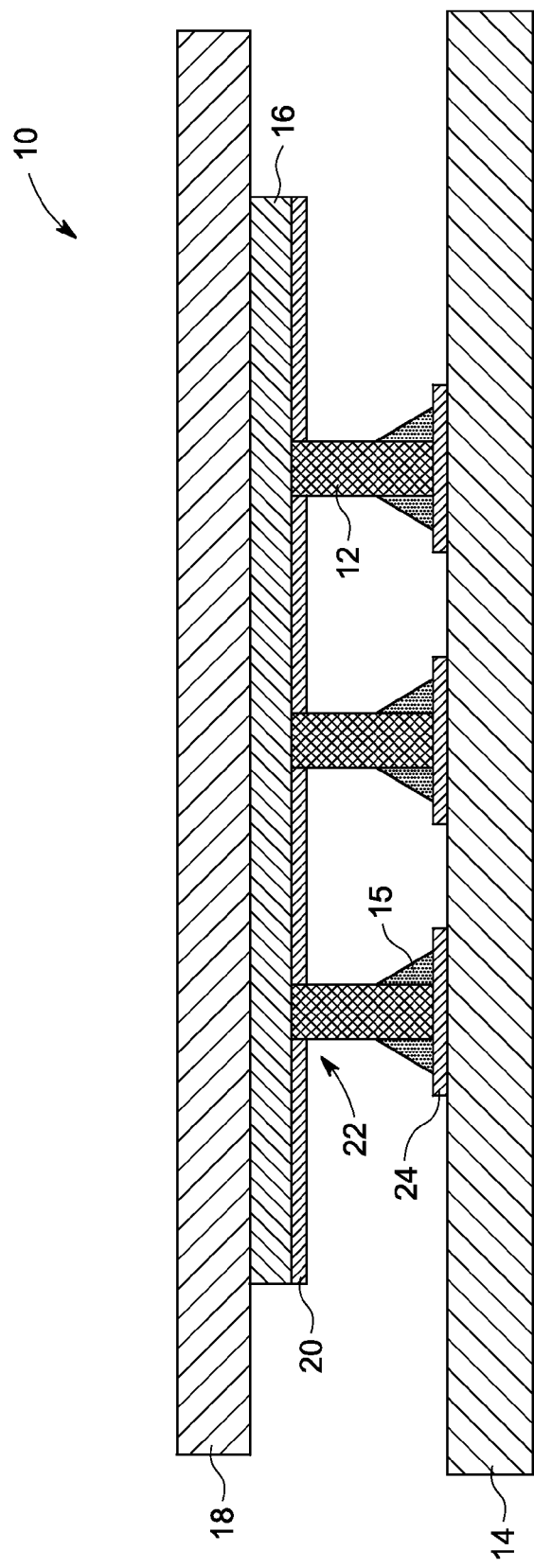

The invention relates generally to micro pin hybrid interconnect arrays and more particularly to a micro pin hybrid interconnect array structure and method for creating the structure that minimizes coefficient of thermal expansion (CTE) mismatches between a crystal and the substrate to which it is attached.

Cadmium zinc telluride (CZT) and cadmium telluride (CdTe) crystals are extremely brittle materials and pose great difficulties in packaging, especially for large and thin crystals. Recent discoveries have shown that micro-cracks form in the CZT adjacent to the interconnect produced using a low temperature conductive epoxy adhesive. The CTE mismatch between a crystal and the substrate induces substantial strain in the interconnect to crystal interface, causing severe reliability problems, especially when using organic substrates that have a CTE of 11 ppm/C or greater. The greatest strain often occurs when the parts are cured (if using an adhesive process) or reflowed (if using a solder process).

Substrate materials are typically selected with a CTE matched as closely as possible to the crystal to minimize the global strain generated during thermal cycling, as the substrate and crystal expand and contract. Alumina ceramic substrates are usually chosen for use with CZT detectors.

Further analysis has indicated that micro-cracks can form in CZT crystals mounted on ceramic substrates with conductive epoxy interconnects, as a result of local CTE mismatches between the conductive adhesive and CZT, within a single interconnection point. Conductive epoxies are known to have CTEs much higher than CZT. Also, when the temperature exceeds the glass transition temperature (Tg), of the epoxy, the CTE dramatically increases to values typically 4-5 times greater than the CTE below Tg.

Indium bump bonding, conductive adhesives and low temperature solder are currently used to attach CZT detector crystal substrates. Very little work has been done on the reliability of packages using these crystals; and the work done to date appears to be very limited when compared with industry standard packages. Thin (<5 mm) CZT and CdTe crystals are notoriously difficult to package without damage. CZT detectors are typically exposed to only the mildest reliability testing because they are known to be so fragile. It is well known that a 0.5 mm thick CdTe crystal can easily crack, even when carefully handled. The likelihood for cracking is very high when this type of crystal is attached to a high CTE interposer, such as an organic interposer.

It would therefore be advantageous to provide a structure for interconnecting CZT and/or CdTe to an interposer that offers low local strain and that can accommodate conventional attachment methods available today to manufacturers.

BRIEF DESCRIPTION

Briefly, in accordance with one embodiment, a micro pin hybrid interconnect array comprises a crystal anode array and a ceramic substrate, wherein the crystal and substrate are joined together via an interconnect geometry having a large aspect ratio of height to width, wherein the joint affixing the interconnect to the crystal anode array is devoid of solder.

According to another embodiment, a micro pin hybrid interconnect array comprises a crystal anode array and a ceramic substrate, wherein the array and substrate are joined together via a compliant micro pin hybrid interconnect configuration such that mechanical strains between the array and interconnect during temperature excursions remain below that achieved using conventional solder bump bonding to join a crystal anode array to a ceramic substrate.

According to yet another embodiment, a method of forming a micro pin hybrid interconnect array comprises providing a crystal anode array and a ceramic substrate, and joining together the array and substrate via an compliant micro pin hybrid interconnect configuration that reduces local strain in each region where the array and substrate are joined together, such that mechanical strains between the array and the interconnect during temperature excursions remain below that achievable using solder bonding to join a crystal anode array to an interconnect to form a micro pin hybrid interconnect array.

DRAWINGS

These and other features, aspects, and advantages of the present invention will become better understood when the following detailed description is read with reference to the accompanying drawings in which like characters represent like parts throughout the drawings, wherein:

FIG. 1 illustrates a micro pin hybrid interconnect array that employs copper stud or pillar interconnects attached to a ceramic substrate with solder and further attached to a crystal anode array without solder according to one embodiment;

FIG. 2 illustrates a micro pin hybrid interconnect array that employs gold stud bump or plated pillar interconnects attached to both a ceramic substrate and a crystal anode array via compression bonding devoid of solder according to another embodiment; and FIG. 3 illustrates a micro pin hybrid interconnect array that employs gold stud bumps or plated pillar interconnects attached to a ceramic substrate via a fine deposit of conductive epoxy and further attached to a crystal anode array without solder or epoxy according to yet another embodiment.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION

FIG. 1 illustrates a micro pin hybrid interconnect array 10 that employs copper stud or pillar interconnects 12 attached to a ceramic substrate 14 with solder 15 and further attached to one anode pad 16 of a crystal anode array 18 without solder according to one embodiment. A preferred method for creating this type of interconnection according to one embodiment comprises first cleaning the crystal anode array 18. Subsequent to cleaning the crystal anode array 18, deposition of a under bump metallization (UBM) layer (Ti—W, Ni, Au or Ti—W, Cu, Ni, Au) to form an anode pad 16 on the crystal followed by a photoresist sheet 20 is applied to the anode pad 16. The photoresist sheet 20 is then patterned to form openings 22 in the photoresist sheet 20. The openings 22 are plated up with copper (Cu) via electrolytic or electroless plating to form high aspect ratio height to width Cu pillars 12. The remaining photoresist 20 is then removed, leaving only the Cu pillars 12 that are now attached to the anode pad 16 of the crystal anode array 18.

A solder paste, e.g. type 6 or finer paste, may then be applied to the substrate 14 in areas where the attachment will be made between the Cu pillars 12 and circuit metallization 24 on the ceramic substrate 14. The solder paste is then reflowed to form solder deposits. The solder deposits may be coined to ensure they are substantially flat and of substantially equal height according to one aspect of the invention. Next, a solder flux is applied over the whole substrate 14, covering the solder deposits. Subsequent to application of the solder flux, the Cu pillars 12 attached to the crystal anode array 18 are positioned such that each Cu pillar 12 is aligned with a corresponding solder deposit on the substrate 14. The solder is again reflowed to form a metallurgical joint 15 between the solder and a corresponding Cu pillar 12. Self-alignment of the crystal anode array 18 to the ceramic substrate 14 occurs during this reflow process. Any residual flux remaining on the resultant micro pin hybrid interconnect array 10 may be removed by cleaning if the solder flux is water-soluble. Finally, the substrate 14 may be conditioned by using plasma etching and subsequent application of an underfill according to one aspect of the invention.

Coining of the foregoing solder deposits is not required if the solder paste is not reflowed as described above. Further, flux may be applied to only the interconnection points according to one aspect, by dipping the tips of the Cu pillars 12 into the flux. Testing of the resultant micro pin hybrid interconnect array 10 can be employed to determine the yield of the interconnections following the reflow process that forms metallurgical joints 15 between the solder and Cu pillars 12. Any insufficient interconnections can then be reworked if found to be necessary or desirable.

FIG. 2 illustrates a micro pin hybrid interconnect array 30 that employs gold stud bumps or plated pillar interconnects 32 attached to both a ceramic substrate 14 and to a crystal anode array 18 via compression bonding devoid of solder according to another embodiment. The stud bumps or plated pillars 32 are joined via a compressive displacement bonding process to one or more substrate pads 34 that may each comprise a noble metal plated pad on the substrate 14 according to one embodiment. A low temperature underfill 36 that encapsulates the interposers 32 may be used that cures during the foregoing bonding operation according to one embodiment. The foregoing bonding process can be done at room temperature, and so allows the substrate 14 to have a larger CTE mismatch with the crystal 18 without producing any excessive strain.

One bonding process to achieve the micro pin hybrid interconnect array structure 30 commences by first cleaning a crystal anode array 18. Gold stud bumps or plated pillars 32 are next applied to the UBM anode pad on the array pixel via a compressive displacement bonding process or via a low temperature solder attach process such as that described herein with reference to FIG. 1. An epoxy underfill 36 is then applied to the surface of the substrate 14 to encapsulate the gold stud bumps or plated pillars 32. The crystal anode array 18 is positioned such that the bumps or pillars 32 align with corresponding substrate pads 34. Subsequent to aligning the bumps or pillars 32 with the corresponding substrate pads 34, pressure is applied to achieve the requisite compressive displacement bonding force between each bump or pillar 32 and its corresponding substrate pad 34. Subsequent to completion of the foregoing bonding process, heat can be applied to the epoxy underfill 36 if necessary to cure the underfill 36.

FIG. 3 illustrates a micro pin hybrid interconnect array 40 that employs gold stud bumps or plated pillar interconnects 42 attached to a ceramic substrate 14 via a fine deposit of conductive epoxy 44 and further attached to a crystal anode array 18 without solder or epoxy according to yet another embodiment. Each gold stud bump or plated pillar 42 is embedded in a fine deposit of conductive epoxy where it is attached to the substrate 14 as shown. Each bump or pillar 42 preferably has an aspect ratio of height to width that is greater than one.

Micro pin hybrid interconnect array 40 can be formed according to one embodiment by first cleaning the crystal anode array 18. Gold plating or stud bumping is then employed to form gold stud bumps or plated pillars 42 using a process such as described herein with reference to FIGS. 1 and 2. Fine deposits of conductive adhesive paste 44 are applied onto substrate pads 34 using, for example, stencil printing or syringe dispensing processes. The bumps or pillars 42 attached to the crystal anode array 18 are then aligned with corresponding deposits of conductive epoxy (adhesive paste) 44 and pressed into place. The adhesive 44 is then temperature cured, and plasma etching is applied if deemed necessary. An underfill such as underfill 36 described with reference to FIG. 2 can be employed if deemed necessary to accommodate a particular application.

Although the micro pin hybrid interconnect arrays described herein are shown using a single interconnect applied to each detector-substrate electrode pair, it shall be understood that the invention is not so limited, and that each detector-substrate electrode pair can just as easily be implemented using multiple small diameter interconnections on each electrode. The use of multiple small diameter interconnections on each electrode allow for use of higher aspect ratio of height to width interposers, providing greater stress relief, and improving reliability. Multiple small diameter interconnections, for example, increases reliability through redundancy in the connections.

In summary explanation, embodiments of a micro pin hybrid interconnect array in accordance with the principles described herein includes a crystal anode array and a ceramic substrate. The array and substrate are joined together using an interconnect geometry having a large aspect ratio of height to width. The joint affixing the interconnect to the crystal anode array is devoid of solder.

A micro pin hybrid interconnect array implemented in accordance with the principles described herein advantageously does not require a complex and unique under bump metallization (UBM) structure on an anode pad to withstand the consumption of a very thin Au electrode during a reflow solder process because the pads on the detector crystal are not directly exposed to the solder of flux. The high aspect ratio of height to width bump or pillar interconnects allows them to bend slightly to accommodate strain caused by any CTE mismatch with the substrate over thermal cycling required for solder reflow. This feature prevents cracking of the fragile detector crystal during processing and in its use environment.

Once the bumps or pillar interconnects are formed on the CZT, the remainder of the processing can advantageously be implemented using widely available manufacturing equipment. Further, plating processes employed when forming the bumps or pillar interconnects does not require particularly expensive or specialized equipment.

Detector crystals advantageously are exposed to minimal mechanical handling during processing according to the principles described herein. Further, interconnects can be reworked prior to underfilling when utilizing processes described herein with reference to FIGS. 1 and 2.

Further, a micro pin hybrid interconnect array implemented in accordance with the principles described herein advantageously can provide very fine pitch anode arrays down to a pitch of about 0.050 mm Known processes used to accomplish this feature are disadvantageous in that they are very expensive and are not compatible with conventional processing equipment and methods. A micro pin hybrid interconnect array implemented in accordance with the principles described herein, for example, advantageously is self-aligning during the reflow process, which reduces the required precision in alignment and placement of the crystal on the substrate.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method of forming a micro pin hybrid interconnect array, the method comprising:
   providing a crystal anode array and a ceramic substrate, the crystal anode array comprising a single substantially planar unitary solderable under bump metallization (UBM) layer; and
   joining together the array and substrate via a compliant micro pin hybrid interconnect configuration that reduces local strain in each region where the array and substrate are joined together, such that mechanical strains during temperature excursions remain below that achieved using solder bonding to join a crystal anode array to an interconnect to form a micro pin hybrid interconnect array.

2. The method according to claim 1, wherein joining together the array and substrate via a compliant micro pin hybrid interconnect configuration comprises:
   cleaning the anode crystal array;
   applying a photoresist sheet to the UBM;
   patterning the photoresist sheet to form openings in the photoresist; and
   filling the openings with copper to form copper pillars attached to the UBM.

3. The method according to claim 2, wherein joining together the array and substrate via a compliant micro pin hybrid interconnect configuration further comprises:
   applying solder paste to desired portions of the substrate;
   placing the anode crystal array such that each copper pillar is aligned with a corresponding deposit of solder paste; and
   reflowing the solder paste to form a metallurgical joint between each copper pillar and its corresponding reflowed solder deposit.

4. The method according to claim 2, wherein joining together the array and substrate via a compliant micro pin hybrid interconnect configuration further comprises:
   applying solder paste to desired portions of the substrate;
   reflowing the solder paste to form solder deposits;
   applying solder flux to the substrate and covering each solder deposit therefrom;
   placing the anode crystal array such that each copper pillar is aligned with a corresponding solder deposit; and
   reflowing the solder deposits to form a metallurgical joint between each copper pillar and its corresponding reflowed solder deposit.

5. The method according to claim 4, further comprising coining each solder deposit prior to applying the solder flux such that each solder deposit is substantially flat and has a substantially identical height with respect to one another.

6. The method according to claim 5, further comprising cleaning residual flux from the micro pin hybrid interconnect array if the flux is water soluble.

7. The method according to claim 6, further comprising:
   conditioning the substrate via plasma etching; and
   applying an underfill between the crystal anode array and the ceramic substrate to encapsulate the copper pillars.

8. The method according to claim 1, wherein joining together the array and substrate via a compliant micro pin hybrid interconnect configuration comprises:
   cleaning the anode crystal array;
   applying gold stud bumps to pixel portions of the UBM via a solderless bonding process;
   applying a desired epoxy underfill to desired surface portions of the substrate;
   placing the anode crystal array such that each gold stud bump is aligned with a corresponding mating substrate pad; and
   applying a desired pressure such that compressive displacement bonding joins the anode crystal array to the substrate via the gold stud bumps.

9. The method according to claim 8, further comprising heating the underfill at a desired temperature until the underfill is fully cured.

10. The method according to claim 1, wherein joining together the array and substrate via a compliant micro pin hybrid interconnect configuration comprises:
    cleaning the anode crystal array;
    affixing gold stud bumps or gold plated pillars to pixel portions of the UBM via a solderless bonding process;
    applying a desired conductive adhesive paste to desired substrate pads;
    placing the anode crystal array such that each gold stud bump or pillar is aligned with a corresponding mating substrate pad; and
    applying a desired pressure such that compressive displacement bonding attaches the anode crystal array to the substrate via the gold stud bumps or pillars.

11. The method according to claim 10, further comprising applying a desired underfill to the crystal anode array and the ceramic substrate to encapsulate the stud bumps or pillars.

* * * * *